(12) United States Patent
McMackin et al.

(10) Patent No.: US 11,199,772 B2
(45) Date of Patent: Dec. 14, 2021

(54) ADJACENT FIELD ALIGNMENT

(71) Applicant: Canon Nanotechnologies, Inc., Austin, TX (US)

(72) Inventors: Ian Matthew McMackin, Austin, TX (US); Wesley Martin, Westfield, IN (US)

(73) Assignee: Canon Nanotechnologies, Inc., Austin, TX (US)

( * ) Notice: Subject to any disclaimer, the term of this patent is extended or adjusted under 35 U.S.C. 154(b) by 421 days.

(21) Appl. No.: 16/437,167

(22) Filed: Jun. 11, 2019

(65) Prior Publication Data

US 2019/0294041 A1    Sep. 26, 2019

Related U.S. Application Data

(63) Continuation of application No. 12/846,211, filed on Jul. 29, 2010, now abandoned.

(60) Provisional application No. 61/231,182, filed on Aug. 4, 2009.

(51) Int. Cl.
*B29C 59/02* (2006.01)
*G03F 7/00* (2006.01)
*B82Y 10/00* (2011.01)
*B82Y 40/00* (2011.01)

(52) U.S. Cl.
CPC ............ *G03F 7/0002* (2013.01); *B82Y 10/00* (2013.01); *B82Y 40/00* (2013.01)

(58) Field of Classification Search
CPC ........ B29C 59/02; B29C 59/022; B82Y 40/00
See application file for complete search history.

(56) References Cited

U.S. PATENT DOCUMENTS

| | | | |
|---|---|---|---|
| 2002/0093122 A1* | 7/2002 | Choi ..................... | B29C 43/003 264/401 |
| 2007/0054097 A1* | 3/2007 | Suehira ................. | B82Y 10/00 428/195.1 |
| 2008/0018875 A1* | 1/2008 | Schram ................. | B82Y 40/00 355/67 |

* cited by examiner

*Primary Examiner* — James Sanders
(74) *Attorney, Agent, or Firm* — Daniel Ratoff; Cameron A. King (57) ABSTRACT

Methods for imprinting on abutted fields of a substrate are described. Generally, a first field of a substrate may be imprinted using an imprint lithography template. The template may then be placed such that a portion of the template overlaps the first field of the substrate while imprinting a second field of the substrate.

19 Claims, 6 Drawing Sheets

ADJACENT FIELD ALIGNMENT

CROSS REFERENCE TO RELATED APPLICATIONS

This application is a continuation of U.S. application Ser. No. 12/846,211 filed on Jul. 29, 2010, which claims priority to U.S. Provisional Application Ser. No. 61/231,182 filed Aug. 4, 2009; both of which are hereby incorporated by reference.

STATEMENT REGARDING FEDERALLY SPONSORED RESEARCH OR DEVELOPMENT

The United States government has a paid-up license in this invention and the right in limited circumstance to require the patent owner to license others on reasonable terms as provided by the terms of 70NANB4H3012 awarded by National Institute of Standards (NIST) ATP Award.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
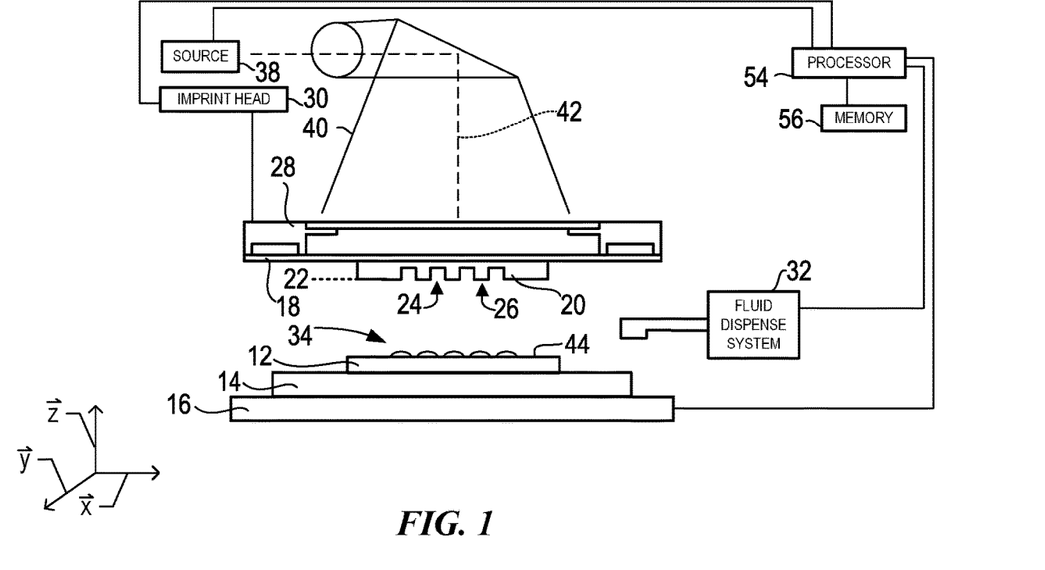
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide motion along the x, y, and z axes. Stage 16, substrate 12, and substrate chuck 14 may also be positioned on a base (not shown).

Spaced-apart from substrate 12 is template 18. Template 18 may include mesa 20 extending therefrom towards substrate 12, mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. No. 7,157,036 and U.S. Patent Publication No. 2005/0187339, both of which are hereby incorporated by reference herein.

Figure 2:
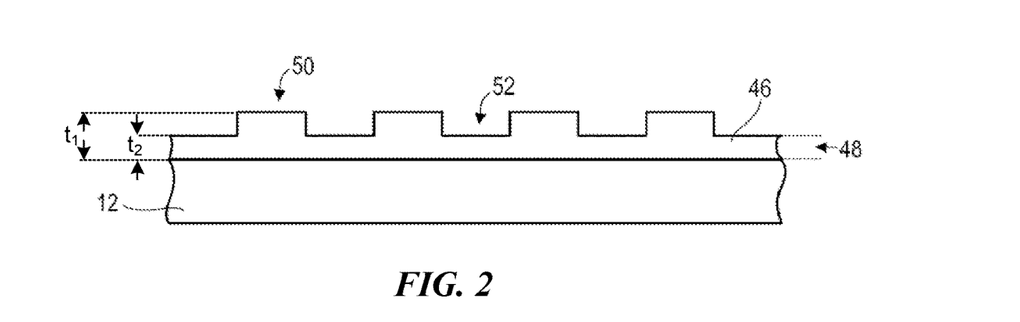
FIG. 2 illustrates a simplified side view of the substrate shown in FIG. 1 having a patterned layer positioned thereon.

Referring to FIGS. 1 and 2, system 10 may further comprise energy source 38 coupled to direct energy 40 along path 42. Imprint head 30 and stage may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness t2.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference herein.

Figure 3:
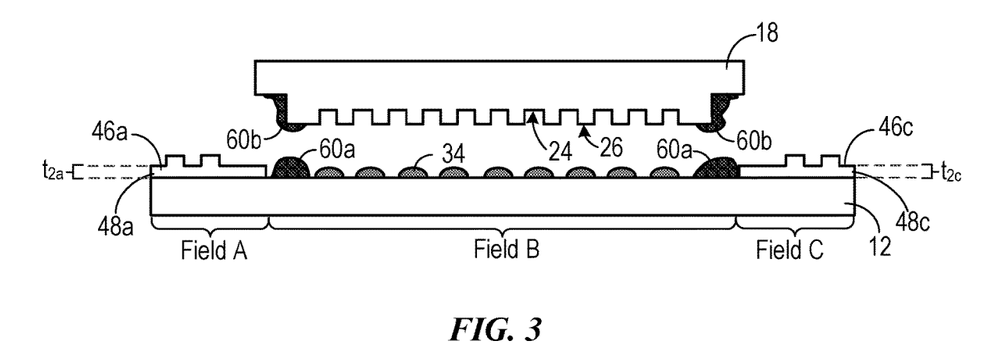
FIG. 3 illustrates a simplified side view of a template and a substrate having extrusions formed thereon.

Referring to FIG. 3, during imprinting, drops of polymerizable material 34 fill the volume between features 24 and 26 of template 18 and the edge of mesa 20 within a desired imprint area on substrate 12. Polymerizable material 34, however, may flow out of this desired imprint area on substrate 12 forming extrusions 60a on substrate 12 as illustrated in FIG. 3. For example, extrusions 60a on substrate 12 may be formed during imprinting of Field A and/or Field C.

Extrusions 60b on template 18 also may be formed during imprinting of Field A and/or Field C. Extrusions 60a and/or 60b may inhibit formation of imprinting Field B. For example, extrusions 60a may form an asperity on substrate 12 exceeding the height of thickness tea of residual layer 48a of Field A and/or thickness $t_{2c}$ of residual layer 48c of Field C. As such, extrusions 60 may inhibit formation of the imprinting field (Field B) by preventing template 18 from attaining a suitable distance from substrate 12.

In the prior art, imprint fields of substrate 12 are separated such that the imprinting area of template 18 does not overlap the previous imprinted field. This process, however, may provide patterned layer 46 having discontinuity in residual layer 48 especially when space between fields is provided to accommodate for extrusions 60a and/or 60b. In CMOS processing (e.g., etching, chemical-mechanical polishing (CMP), and the like), generally residual layer 48 has a substantially constant average thickness t2 without such discontinuity between fields. Additionally, the entire surface of substrate 12 provides valuable real-estate that should be maximized to avoid waste. Separation of imprint fields to avoid overlapping may waste this valuable real-estate.

FIGS. 4-7 describe and illustrate various process methods that may minimize and/or prevent extrusions 60. Further, such methods may provide for imprinting of abutted fields on substrate 12. It should be noted that such techniques may be used singularly or in combination to minimize and/or prevent extrusions 60.

Figure 4:
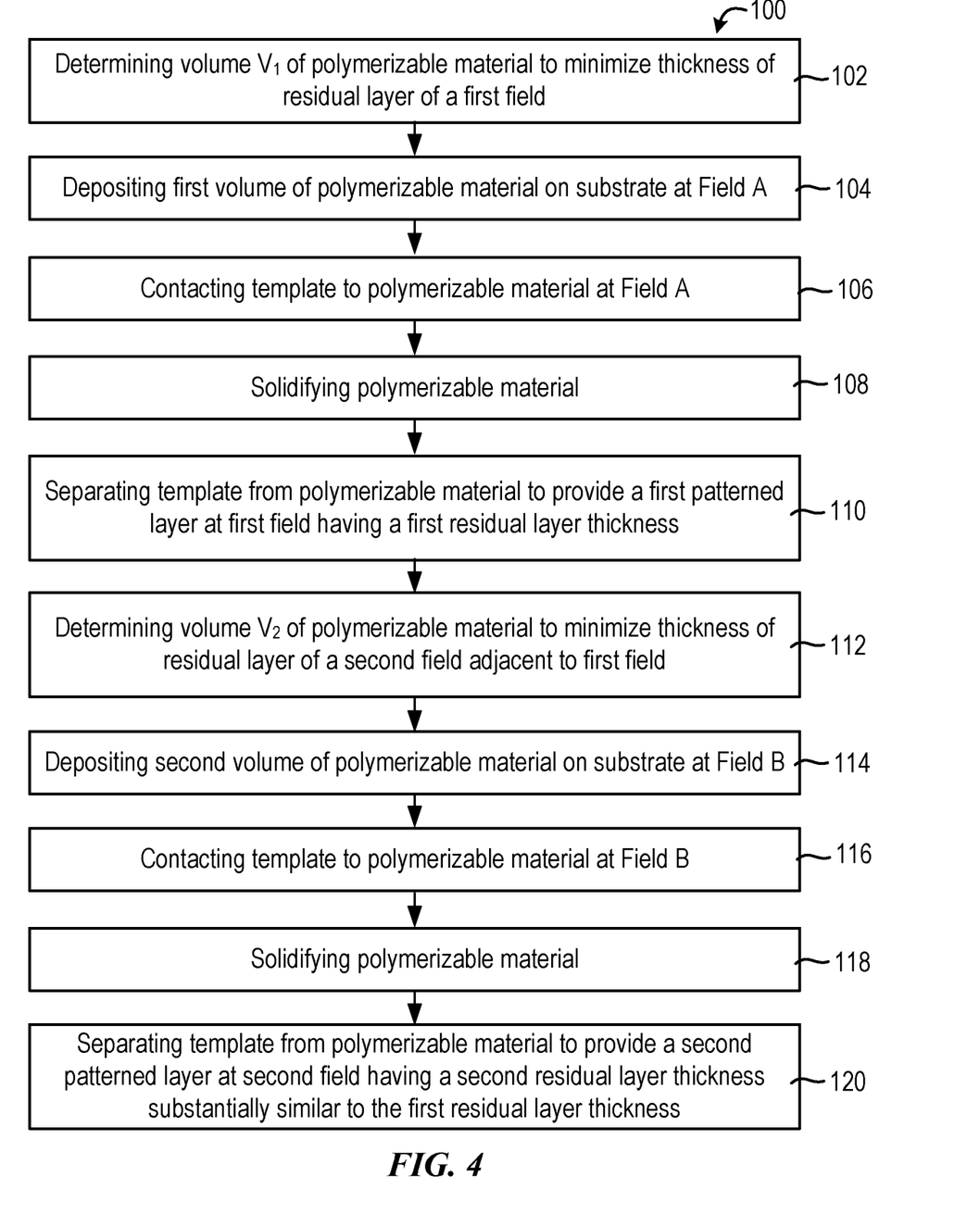
FIG. 4 illustrates a flow chart of a method for imprinting multiple fields to minimize and/or prevent extrusions.

FIG. 4 illustrates a flow chart of a method 100 for imprinting multiple fields to minimize and/or prevent extrusions 60a and/or 60b. Generally, minimizing thickness t2 of residual layer 48 may minimize the total amount of polymerizable material 34 on substrate and thereby minimize occurrence of extrusions 60a and/or 60b. In a step 102, a first volume $V_1$ of polymerizable material 34 may be determined to minimize the thickness tea of residual layer 48 of a first field (Field A) of a substrate 12 (e.g., less than approximately 25 nm). In a step 104, first volume $V_1$ of polymerizable material 34 may be deposited on substrate 12 at first field (Field A). In a step 106, template 18 may contact polymerizable material 34. In a step 108, polymerizable material 34 may be solidified. In a step 110, template 18 may be separated from polymerizable material 34 to provide first patterned layer 48a at first field (Field A). In a step 112, a second volume $V_2$ of polymerizable material 34 may be determined to minimize the thickness $t_{2b}$ of residual layer 48b of a second field (Field B) of a substrate 12 (e.g., less than approximately 25 nm). Second field (Field B) may be adjacent and abutting first field (Field A). Second volume $V_2$ may be substantially similar to first volume $V_1$. Alternatively, second volume $V_2$ may be different than first volume $V_1$. For example, if deposition of material on substrate in first field (Field A) and second field (Field B) is at a substantially similar time, second volume $V_2$ may be increased to account for evaporation of polymerizable material as first field (Field A) may be imprinted prior to second field (Field B).

In a step 114, second volume $V_2$ of polymerizable material 34 may be deposited on substrate 12 at second field (Field B). In a step 116, template 18 may contact polymerizable material 34. In a step 118, polymerizable material 34 may be solidified. In a step 120, template 18 may be separated from polymerizable material 34 to form second patterned layer 48b at second field (Field B). Second patterned layer 48b at second field (Field B) may have a residual layer 48b substantially similar to residual layer 48a of first patterned layer 48a of at first field (Field A).

Figure 5:
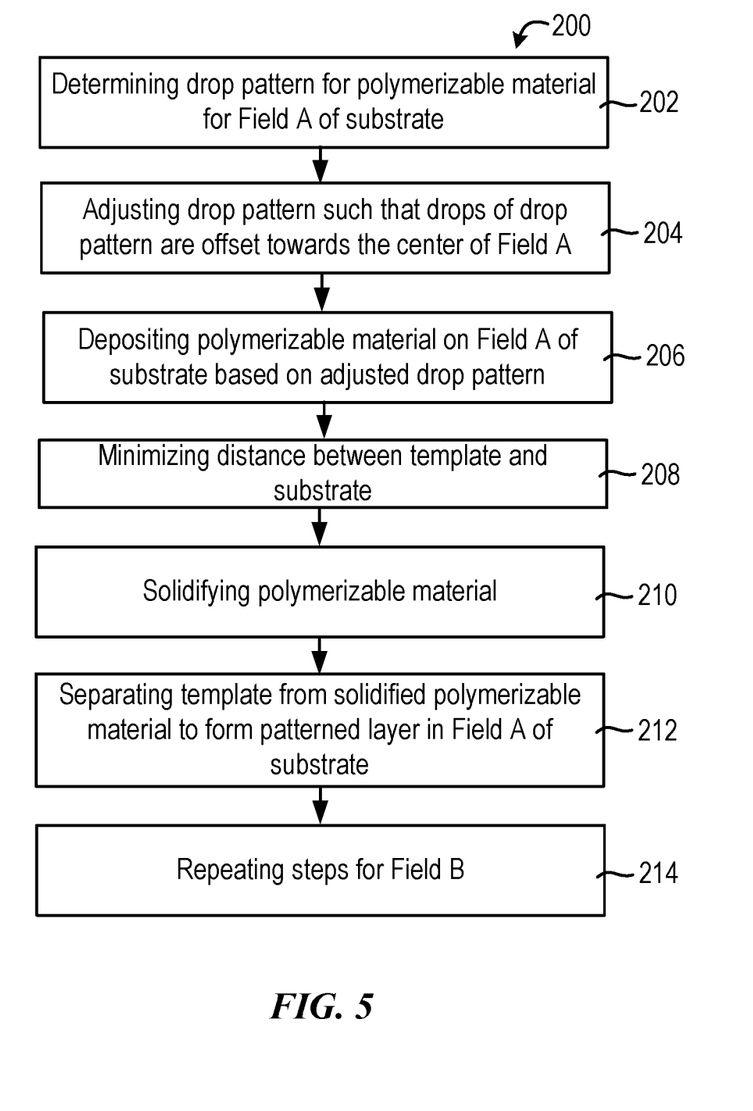
FIG. 5 illustrates a flow chart of a method for retracting polymerizable material from at least one edge of an imprinting area to minimize and/or prevent extrusions.

FIG. 5 illustrates another method for limiting and/or eliminating extrusions 60a and/or 60b. In particular, flow chart 200 illustrates of a method for retracting polymerizable material 34 from at least one edge of the imprinting area to minimize and/or prevent extrusions 60a and/or 60b. In a step 202, a drop pattern for dispensing of polymerizable material 34 on a field may be determined. For example, the drop pattern may be determined by correlating features 24 and/or 26 of template 18 with required volume and/or thickness of residual layer 48a such that drops are spatially correlated to location of features 24 and/or 26 of template 18 and in sufficient quantity to fill volume between template 18 and substrate 12 during imprinting. Exemplary techniques for determination of drop patterns by correlation of features 24 and/or 26 may be found in at least U.S. Ser. No. 11/143,092, U.S. Ser. No. 12/170,229, and U.S. Ser. No. 12/262,669, all of which are hereby incorporated by reference in their entirety.

In a step 204, drop pattern may be adjusted such that drops at edges of drop pattern (e.g., located at edges of patterned layer 48a and/or at edge of the imprinting area) may be offset towards the center C of of the drop pattern (e.g., towards center of Field A). For example, drops may be offset toward the center C of Field A such that during imprinting, features 24 and 26 and the volume between template 18 and substrate 12 may be filled before polymerizable material 34 has an opportunity to flow off mesa 20.

Figure 6:
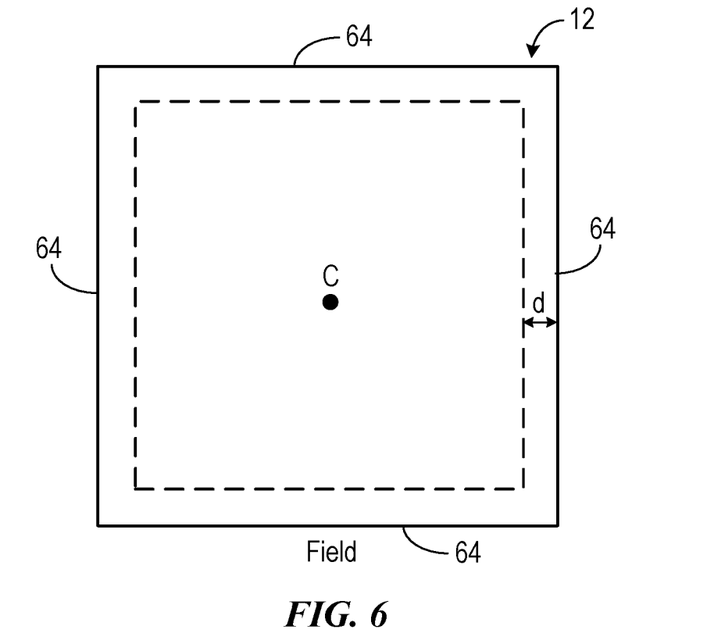
FIG. 6 illustrates a top down view of a substrate having retracted polymerizable material retracted from edges of an imprinting area.

FIG. 6 illustrates one example of offsetting drops toward the center C of Field A by a distance d. Distance d may be a perimeter established about edges 64 of a field. For example, distance d may be a perimeter established about edges 64 of a field at approximately 200 μm. Generally, distance d is substantially similar at all edges 64 of the imprinting field; however, it should be noted that distance d may be different at one or more edges 64 of imprinting field depending on design considerations. For example, distance d may be similar for parallel edges. Further, the magnitude of distance d may be altered based on prior abutting imprinted fields and/or distribution of features 24 and/or 26 of template 18. For example, edge 64 of a field that is abutted next to a prior imprinted field may have a greater distance than another edge 64 of the field. Offsetting may be substantially similar at each edge 64 of the field or such offset distance d may be different at each edge 64 of the field. In one example, the number of drops needed to form an imprint may not be reduced during adjustment of drop pattern; rather drops may be solely offset toward the center of the field.

In a step 206, polymerizable material 34 may be deposited on substrate 12 based on the adjusted drop pattern. In a step 208, distance between template 18 and substrate 12 may be minimized as polymerizable material 34 from drops placed at perimeter of imprinting area according to the adjusted drop pattern reach an edge of mold 20. In a step 210, polymerizable material 34 may be solidified. In a step 212, template 18 may be separated from solidified polymerizable material 34 forming patterned layer 48a in Field A of substrate 12. In a step 214, each of the above steps may be repeated for Field B of substrate 12. Residual layers 48 of Field B and Field A may have substantially similar thickness t2.

Figure 7:
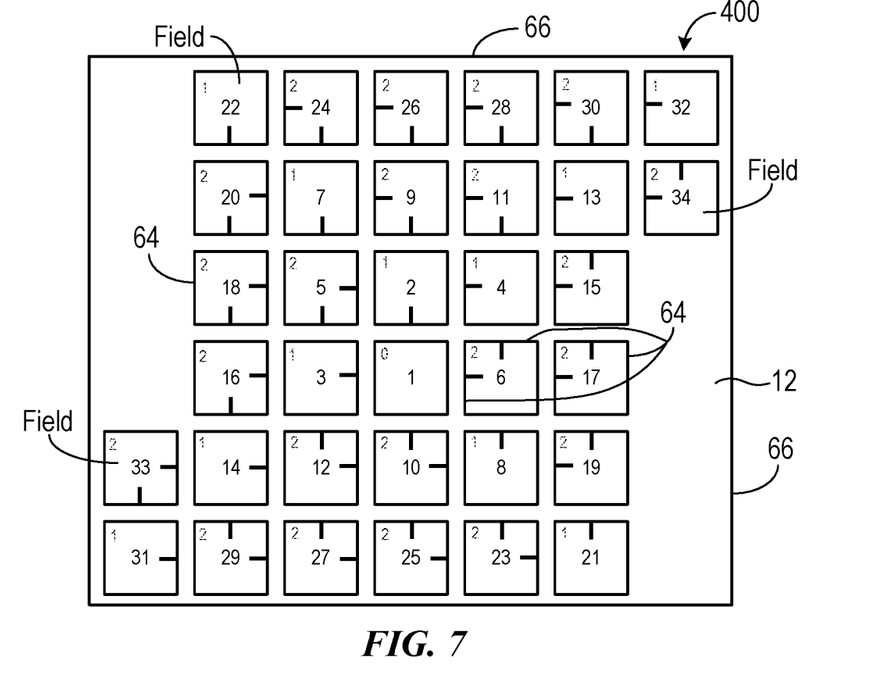
FIG. 7 illustrates one embodiment of a stepping pattern.

Referring to FIG. 7, a stepping pattern 400 may be used to optimally equalize the number of times each edge 64 of a field is abutted to a previously imprinted field. Providing stepping pattern 400 may minimize deposition of polymerizable material 34 off mold 20 during imprinting as described and illustrated in FIGS. 1 and 2. Stepping pattern 400 generally arranges imprint order of fields on substrate 12 such that during imprinting each edge 64 of field abuts a prior imprinted field edge 64. Prior imprinted edges 64 are indicated by dark rectangles in FIG. 7. Edges 64 of prior imprinted fields may be used to contain or provide a boundary for polymerizable material 34 thus minimizing deposition of polymerizable material 34 off of mold 20.

FIG. 7 illustrates stepping pattern 400 wherein each field of substrate 12 is depicted as a square designated by an imprint order. In this stepping pattern 400, the first field (reference number 1) is imprinted in the center of substrate 12 with each subsequent field (reference numbers 2, 3, 4, 5 . . . 34) being imprinted in a spiral-like fashion towards the edge 66 of substrate 12. Using the spiral-like imprinting pattern, each edge 64 of a field may abut at least one prior imprinted field (indicated by dark rectangle) with the edge 64 of the field to be imprinted. The edge 64 adjacent to a prior imprinted field is indicated a by dark rectangle. This edge 64 may provide containment of polymerizable material 34 for the field being imprinted. For example, during the imprinting of field 6, one edge 64 of prior imprinted field 1 and one edge 64 of prior imprinted field 4 may provide containment of polymerizable material 34.

Figure 8:
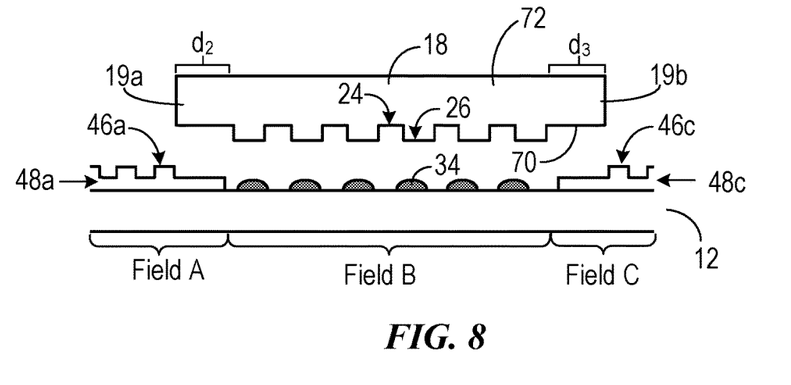
FIG. 8 illustrates a simplified side view of a template overlapping at least a portion of a patterned field during imprinting.
Figure 9:
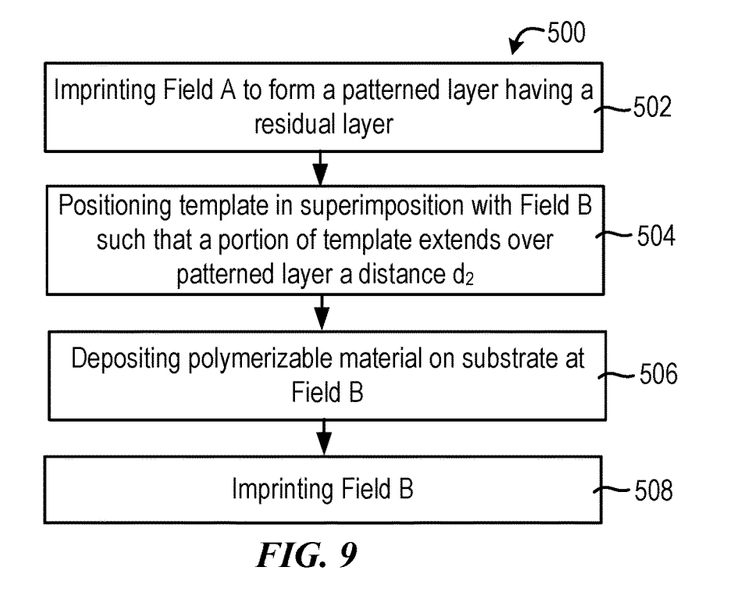
FIG. 9 illustrates a flow chart of a method for imprinting a field using overlap imprinting.

Referring to FIGS. 3, 8 and 9, an overlap imprint method 500 may be used to confine polymerizable material 34 between edges of previously imprinted fields, and minimize and/or prevent extrusions 60a and 60b. Referring to FIGS. 8 and 9, in a step 502, Field A may be imprinted to form patterned layer 46a having residual layer 48a using systems and processes related to FIGS. 1 and 2. Optionally, Field C may be imprinted to form patterned layer 46c having residual layer 48c. In a step 504, template 18 may be positioned in superimposition with Field B such that at least a portion 19a of template 18 is in superimposition with at least a portion of patterned layer 46a of Field A. Template 18 may include a first side 70 and a second side 72. First side 70 may include features 24 and 26 as described in relation to FIG. 1. Portion 19a of template 18 overlapping patterned layer 46a may be substantially planar and positioned adjacent to features 24 and 26. Generally, as features 24 and 26 of template 18 contact polymerizable material 34 during the imprint process (described in detail in relation to FIGS. 1 and 2), portion 19a is at a slight distance from prior imprinted patterned layer 46 of an adjacent field (e.g., patterned layer 46a of Field A). The distance is such that features 24 and 26 of template 18 may contact polymerizable material 34 and portion 19a does not contact prior imprinted patterned layer 46.

Portion 19a of template 18 may extend (i.e. overlap) over patterned layer 46a a distance $d_2$ as illustrated in FIG. 8. Generally, portion 19a may extend over residual layer 48a of patterned layer 46a. Thickness of residual layer 48a becomes a concern in the overlapping of portion 19a, as a relatively thick residual layer 48a may inhibit imprinting of the adjacent field. In one example, thickness of residual layer 48a is less than 5 μm to provide for imprinting of the adjacent field without inhibiting contact between template 18 and polymerizable material 34 positioned on the adjacent field.

Optionally, portion 19b of template 18 may extend over another adjacent field (e.g., patterned layer 46c) simultaneously at a distance $d_3$. Distance $d_2$ and $d_3$ may be substantially similar or different. In a step 506, polymerizable material 34 may be deposited or coated on substrate 12 in the region of Field B. In a step 508, Field B may be imprinted using system and processes of FIGS. 1 and 2.

Referring again to FIG. 3, it should be noted that by minimizing gas flow during the imprinting process, formation of extrusions 60a and/or 60b may be minimized and/or prevented. Deposition of polymerizable material 34 on mold and/or template 18 may contribute to formation of extrusions 60. As such, by adjusting gas flow, vapor born polymerizable material 34 may be minimized. By minimizing deposition of polymerizable material 34 on mold 20 (e.g., wall of mold 20), extrusions 60a and/or 60b may be minimized and/or prevented.

What is claimed is:
1. A method comprising:
contacting, with a patterned surface portion of an imprint lithography template, a first portion of polymerizable material positioned within a first field of a substrate;
polymerizing the first portion of the polymerizable material to form a first patterned layer on the first field of the substrate, the first patterned layer comprising a first residual layer;
separating the template from the first patterned layer;

contacting, with the patterned surface portion of the imprint lithography template, a second portion of polymerizable material positioned within a second field of a substrate;

polymerizing the second portion of the polymerizable material to form a second patterned layer on the second field of the substrate, the second patterned layer comprising a second residual layer;

separating the template from the second patterned layer;

after separating the template from the second patterned layer, positioning the template with respect to the substrate such that i) the patterned surface portion of the template is in superimposition with a third field of the substrate, ii) a first planar, featureless portion of the template overlaps a planar edge portion of the first residual layer of the first patterned layer on the first field of the substrate, iii) a second planar, featureless portion of the template overlaps a planar edge portion of the second residual layer of the second patterned layer on the second field of the substrate, the third field abutting and adjacent to each of the first field and the second field;

after positioning the template with respect to the substrate, i) contacting, with the patterned surface portion of the template, a third portion of polymerizable material positioned within the third field of the substrate, and ii) confining, with the first planar, featureless portion of the template that overlaps the planar edge portion of the first residual layer of the first patterned layer on the first field of the substrate and the second planar, featureless portion of the template that overlaps the planar edge portion of the second residual layer of the second patterned layer on the second field of the substrate, the third portion of the polymerizable material to the third field of the substrate to prevent extrusion of the third portion of the polymerizable material to the first field of the substrate proximate the first residual layer and the second field of the substrate proximate to the second residual layer;

polymerizing the third portion of polymerizable material to form a third patterned layer on the third field of the substrate; and separating the template from the third patterned layer;

wherein a height difference between the first planar, featureless portion of the template and a surface corresponding to the first residual layer of the patterned surface portion is a height that is able to confine the polymerizable material when contacting the template with polymerizable material on the third field, and a height difference between the second planar, featureless portion of the template and a surface corresponding to the second residual layer of the patterned surface portion is a height that is able to confine the polymerizable material when contacting the template with polymerizable material on the third field.

2. The method of claim 1, wherein a thickness of the first residual layer and a thickness of the second residual layer are substantially similar.

3. The method of claim 1, wherein a volume of the first portion of the polymerizable material is determined to minimize the thickness of the first residual layer.

4. The method of claim 3, wherein the thickness of the first residual layer is less than approximately 25 nm.

5. The method of claim 1, further comprising:
determining a drop pattern for dispensing of the first portion of the polymerizable material on the first field of the substrate;

adjusting the drop pattern such that drops of the drop pattern are offset a distance towards a center of the drop pattern to yield an adjusted drop pattern, wherein the distance establishes a perimeter at edges of the drop pattern; and, dispensing the polymerizable material on the first field of the substrate according to the adjusted drop pattern.

6. The method of claim 5, wherein the drop pattern for dispensing of the first portion is determined by correlating features of the template with a required thickness of the first residual layer such that the drops of the polymerizable material dispensed on the substrate are spatially correlated to locations of features of the template and in sufficient quantity to fill a volume between the template and the substrate during imprinting.

7. The method of claim 5, wherein the distance is substantially similar at all edges of the drop pattern.

8. The method of claim 5, wherein the distance at one edge of the drop pattern differs from the distance at another edge of the drop pattern.

9. The method of claim 5, wherein the distance is greater at an edge of the drop pattern that abuts an imprinted field.

10. The method of claim 1, further comprising:
imprinting a plurality of fields using a stepping pattern such that during imprinting each edge of each field of the plurality of fields abuts an imprinted field.

11. The method of claim 10, wherein contacting the plurality of fields contains the polymerizable material for each field of the plurality of fields.

12. A method comprising:
contacting polymerizable material positioned on a first field of a substrate using a patterned surface portion of an imprint lithography template to form a first patterned layer on the first field having a first residual layer, the imprint lithography template having a first side and a second side, the first side comprising the patterned surface portion having a plurality of features and at least two substantially planar, featureless portions adjacent to the patterned surface portion;

after contacting the polymerizable material positioned on the first field of the substrate, positioning the imprint lithography template with respect to the substrate such that the plurality of features of the patterned surface portion are in superimposition with polymerizable material positioned on a second field of the substrate, after positioning the imprint lithography template with respect to the substrate, contacting, with the plurality of features of the patterned surface portion, the polymerizable material positioned on the second field to form a second patterned layer on the second field having a second residual layer, after contacting the polymerizable material positioned on the second field of the substrate, repositioning the imprint lithography template with respect to the substrate such that i) the plurality of features of the patterned surface portion are in superimposition with polymerizable material positioned on a third field of the substrate, ii) a first planar, featureless portion of the template is in superimposition with a planar edge portion of the first residual layer of the first patterned layer, and iii) a second planar, featureless portion of the template is in superimposition with a planar edge portion of the second residual layer of the second patterned layer, the third field abutting and adjacent to each of the first field and the second field; and after repositioning the imprint lithography template with respect to the substrate, i) contacting, with the plurality of features of the patterned surface portion, the polymerizable material positioned on the third field to form a third patterned layer on the third field, and ii) confining, with the first planar, featureless portion of the template that overlaps the planar edge portion of the first residual layer of the first patterned layer on the first field of the substrate and with the second planar, featureless portion of the template that overlaps the planar edge portion of the second residual layer of the second patterned layer on the second field of the substrate to prevent extrusion of the polymerizable material positioned on the third field to the first field and the second field;

wherein a height difference between the first planar, featureless portion of the template and a surface corresponding to the first residual layer of the patterned surface portion is a height that is able to confine the polymerizable material when contacting the template with polymerizable material on the third field, and the height difference between the second planar, featureless portion of the template and a surface corresponding to the second residual layer of the patterned surface portion is a height that is able to confine the polymerizable material when contacting the template with polymerizable material on the third field.

13. The method of claim 12, wherein a thickness of the first residual layer is substantially similar to a thickness of the second residual layer.

14. The method of claim 12, wherein a thickness of the first residual layer is less than about 25 nm.

15. The method of claim 12, wherein the planar, featureless portion of the template is in superimposition with the first field during contacting of the second field and at a distance from the first residual layer.

16. A method for forming a patterned layer with an imprint lithography template, comprising:
    positioning a patterned surface portion of the imprint lithography template over first polymerizable material deposited on a first field of a substrate;
    reducing the distance between the template and the substrate such that the patterned surface portion of the template contacts the first polymerizable material;
    solidifying the first polymerizable material to form a first patterned layer on the first field of the substrate, the first patterned layer comprising a first residual layer;
    separating the template from the first patterned layer on the first field;
    positioning the patterned surface portion of the imprint lithography template over second polymerizable material deposited on a second field of a substrate;
    reducing the distance between the template and the substrate such that the patterned surface portion of the template contacts the second polymerizable material;
    solidifying the second polymerizable material to form a second patterned layer on the second field of the substrate, the second patterned layer comprising a second residual layer;
    separating the template from the second patterned layer on the second field;
    after separating the template from the second patterned layer, positioning the imprint lithography template with respect to the substrate such that i) the patterned surface portion of the template is in superimposition with polymerizable material deposited on a third field of the substrate, ii) a first planar, featureless portion of the template overlaps a planar edge portion of the first residual layer of the first patterned layer on the first field, and iii) a second planar, featureless portion of the template overlaps a planar edge portion of the second residual layer of the second patterned layer on the second field, the third field abutting and adjacent to each of the first field and the second field;
    reducing the distance between the template and the substrate such that i) the patterned surface portion of the template contacts the polymerizable material positioned on the third field, and ii) the third portion of the polymerizable material is confined to the third field of the substrate with the first planar, featureless portion of the template that overlaps the planar edge portion of the first residual layer of the first patterned layer on the first field of the substrate and with the second planar, featureless portion of the template that overlaps the planar edge portion of the second residual layer of the second patterned layer on the second field of the substrate to prevent extrusion of the polymerizable material positioned on the third field to the first field and the second field;
    solidifying the polymerizable material to form a third patterned layer on the third field of the substrate; and
    separating the template from the third patterned layer on the third field of the substrate;
    wherein a height difference between the first planar, featureless portion of the template and a surface corresponding to the first residual layer of the patterned surface portion is a height that is able to confine the polymerizable material when contacting the template with polymerizable material on the third field, and a height difference between the second planar, featureless portion of the template and a surface corresponding to the second residual layer of the patterned surface portion is a height that is able to confine the polymerizable material when contacting the template with polymerizable material on the third field.

17. The method of claim 16, wherein a thickness of the first and the second residual layers are substantially similar.

18. The method of claim 1, wherein the first planar, featureless portion of the template overlaps the planar edge portion of the first residual layer of the first patterned layer on the first field of the substrate a first distance, and wherein the second planar, featureless portion of the template overlaps the planar edge portion of the second residual layer of the second patterned layer on the second field of the substrate a second distance, where the first distance differs from the second distance.

19. The method of claim 1, wherein the first planar, featureless portion of the template overlaps the planar edge portion of the first residual layer of the first patterned layer on the first field of the substrate a first distance, and wherein the second planar, featureless portion of the template overlaps the planar edge portion of the second residual layer of the second patterned layer on the second field of the substrate a second distance, where the first distance is substantially the same as the second distance.

* * * * *